US006057229A

United States Patent [19]
Hieber et al.

[11] Patent Number: 6,057,229
[45] Date of Patent: *May 2, 2000

[54] METHOD FOR METALLIZING SUBMICRON CONTACT HOLES IN SEMICONDUCTOR BODIES

[75] Inventors: Konrad Hieber, Neukeferloh; Helmuth Treichel, Augsburg; Heinrich Koerner, Bruckmuehl, all of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/828,677

[22] Filed: Mar. 31, 1997

[30] Foreign Application Priority Data

Mar. 29, 1996 [DE] Germany ............................ 196 12 725

[51] Int. Cl.[7] .............................................. H01L 21/4763
[52] U.S. Cl. .......................... 438/630; 438/680; 438/683; 438/907; 438/908
[58] Field of Search ................................... 438/630, 680, 438/683, 907, 908

[56] References Cited

U.S. PATENT DOCUMENTS

| 4,737,474 | 4/1988 | Price et al. ............................... 437/200 |
| 5,376,405 | 12/1994 | Doan et al. ........................... 437/126.1 |
| 5,462,895 | 10/1995 | Chen . | |
| 5,846,881 | 12/1998 | Sandhu et al. .......................... 438/683 |

FOREIGN PATENT DOCUMENTS

| 4132560C1 | 4/1993 | Germany . |
| 4132561C1 | 8/1994 | Germany . |
| 5-160065 | 6/1993 | Japan . |

OTHER PUBLICATIONS

"Nucleation and growth of chemically vapor deposited tungsten on various substrate materials: A review" (Broadbent), J. Vac. Sci. Technol. B 5(6) Nov./Dec. 1987, pp. 1661–1666.

"Selectric Growth of Aluminum Using a Novel CVD System" (Amazawa et al.), IEEE, 1988, pp. 442–445.

"Integrated Chemical Vapor Deposition and Plasma Etchback of Tungsten in a Multichamber, Single–Wafer System" (Riley et al.), J. Electrochem. Soc., vol. 138, No. 10, Oct. 1991, pp. 3008–3013.

"Contact Hole Fill with Low Temperature LPCVD TiN" (Raaijmakers et al.), to be published in Proceedings of the 7th International IEEE VLSI . . . , Jun. 1990, pp. 1–7.

"Chemical Vapor Deposition of Refractory Metal Silicides for VSLI Metallization" (Bernard et al.), Solid State Technology, Feb. 1989, pp. 79–84.

"Sputtering's Task: Metallizing Holes" (Burggraf et al.), Semiconductor International, Dec. 1990, pp. 28–31.

"Recent Developments in Silyl–Transition Metal Chemistry" (Aylett), Plenary Lecture given at the Fifth International Symposium on Organosilicon Chemistry, Karlsruhe, Aug. 14–18, 1978, pp. 327–355.

"Purposeful Chemical Design of MOCVD Precursors for Silicon–Based Systems" (Aylett), Mat. Res. Symp. Proc., vol. 131, 1989.

"How to Make Metal Silicide Thin Films from Molecular . . . ", R.M. Laine (ed), Transformation of Organometallics into Common and Exotic Materials: Design and Activation, 1988, pp. 165–177.

"Selective deposition of silicon by plasma–enhanced chemical vapor deposition using pulsed siliance flow" (Parsons), Appl. Phys. Lett. 59 (20), Nov. 11, 1991, pp. 2546–2548.

"LPCVD of Titanium Disilicide" (Bouteville et al.), J. Electrochem. Soc.: Solid–State Science and Technology, Aug. 1987, pp. 2080–2083.

"Silicides for VLSI Applications" (S.P. Murarka), 1983.

Primary Examiner—John F. Niebling
Assistant Examiner—David A Zarneke
Attorney, Agent, or Firm—Herbert L. Lerner; Laurence A. Greenberg; Werner H. Stemer

[57] ABSTRACT

Submicron contact holes in semiconductor bodies are metalized in a single operation. A titanium-rich layer is first deposited, which is followed by a low-resistance $TiSi_2$ layer. The two layers are thus deposited in one contiguous CVD process inside a single CVD chamber.

14 Claims, No Drawings

METHOD FOR METALLIZING SUBMICRON CONTACT HOLES IN SEMICONDUCTOR BODIES

BACKGROUND OF THE INVENTION

1. Field of the Invention

The invention relates to a method for metallizing submicron contact holes in semiconductor bodies, in which metal is deposited in the submicron contact hole.

Such methods are increasingly necessary in semiconductor technology, since often a plurality of conductive layers, which are disposed with an increasing scale of integration in various planes, are used. Suitably structured, they serve as conductor tracks for electric currents. These tracks are insulated from one another by suitable nonconductive layers. If conductor tracks that are disposed in different planes are to be conductively connected to one another or to the Si substrate, then an opening (contact hole) must be structured in the intervening insulation layer. Sometimes, however, a direct connection is precluded for physical reasons. For instance, an $n^+$-doped silicon substrate cannot be contacted directly with an AlSi (1%) conductor track. That would create a diode instead of an ohmic contact, since the silicon that precipitates out is $p^+$- doped by aluminum. In such cases, an indirect connection must be made via an intermediate layer. Typically, these intermediate layers, which are intended to make an ohmic contact with the silicon, comprise titanium (Ti), titanium silicide ($TiS_x$, where $x \leq 2$) or titanium/tungsten (TiW). A barrier layer is also necessary, which preferably comprises titanium nitride (TiN) or TiW. Both of these materials exhibit relatively high impedance, with a specific resistance of 70 to 150 $\mu\Omega$cm.

With increasing miniaturization of microelectronic components ("submicron technology"), the diameters of the connecting holes are becoming ever smaller, yet because at the same time better planarization of the insulation layers is necessary, they are also becoming ever deeper. For reasons of reliability and because of the trend to faster switching times and greater current densities, it is necessary that the connecting holes be metallized without shrink holes with a highly conductive material, while at the same time replicably low-impedance contacts to all the layer materials in question must also be assured.

As the hole aspect ratios continue to increase (i.e., the ratio between depth and diameter), this contact metallizing can no longer be done by deposition of the usual layer construction (such as Ti/TiN/W), since current sputtering methods do not allow conformal deposition for Ti/TiN and thus always leave behind a negative blank angle, which even with conformal tungsten CVD leads to shrink hole formation. If one considers that for a contact hole diameter of 0.3 $\mu$m, for instance, at least 50 nm of Ti and 80 nm of TiN must be deposited in order to achieve an adequate, cohesive layer even at the bottom of the contact holes, then all that remains for the low-impedance, current-carrying tungsten is a minimum residual diameter of contact hole of less than 0.1 $\mu$m. Shrink-hole-free filling of the hole is thus precluded. Moreover, this described process sequence is expensive and time-consuming.

In the known, conventional metallizing process (sputtering), one or more metal layers (such as AlSi or Ti/TiN/AlSiCu) are deposited by physical processes (such as sputtering or vapor deposition) and structures are created from them by suitable photographic and etching steps. Because of the poor edge coverage of these methods, this contact metallizing, even at aspect ratios of approximately 1, is feasible only with additional process steps (such as flaring or beveling of the upper half of the contact hole) and makes subsequent processes (such as planarization) more difficult. For metallizing in contact holes with aspect ratios >1 and at elevated current densities, it can no longer be used reliably. Further developments in sputtering technology, such as collimated sputtering (i.e., oriented deposition by means of suitable, for instance mechanical, apertures)—as described, for instance, in P. Burggraaf, Semiconductor International, Dec. 1990, p. 28—do produce thicker layers at the bottom of the contact hole than conventional processes, but also cause the resultant aspect ratios to increase still more. This is so because the thickness of the layer deposited on the horizontal insulator surface always exceeds the thickness of the layer at the bottom of the contact hole. Hence the demands for conformity and planarization in the ensuing processes only become more stringent.

Metallizing of contacts by full-surface CVD tungsten deposition (using $WF_6/H_2$) and back-etching—described, for instance, in P. E. Riley and T. E. Clark, J. Electrochem. Soc. Vol. 138, No. 10 (1991), p. 3008—has progressed relatively far in industrial testing and application. However, it is a complicated and therefore expensive method, because is entails the following individual steps:

b1) sputtering of a contact layer (such as Ti) to produce a low-impedance contact zone at the boundary faces with silicon or aluminum.

b2) sputtering of a barrier layer (such TiN or TiW), to prevent the reactive $WF_6$ molecules from attacking the Ti, Al or Si layers.

b3) full-surface, conformal deposition of the CVD tungsten layer, followed by an etching step, with which the metal is removed from the horizontal insulator layers.

Because of the poor edge coverage of the two sputtering processes (b1 and b2) required, these layers have to be deposited ever thicker as the aspect ratio increases, to obtain a just barely adequate layer thickness in the relative zones of the contact holes and thus to assure the barrier function.

The geometric situation at the outset for the (actually conformal) tungsten deposition becomes appreciably less favorable; shrink-hole-free filling of the holes is no longer possible, and moreover as the hole diameter decreases further, the resultant volumetric proportion of the low-impedance tungsten metal in the contact metallization drops. Even if conformally deposited CVD contact and barrier layers are available, as described for instance in U.S. Pat. No. 5,478,780 to Koerner et al. (corresp. European Patent Application EP 90 106 139), a complicated and expensive method remains, which appears practicable, if at all, in various chambers of a multichamber high-vacuum system.

If some other metal (such as aluminum) or a metalloid (such as TiN) is used instead of tungsten for the contact metallization, which substances can in principle also be conformally deposited using CVD methods (see for instance in U.S. Pat. No. 5,478,780), then the above statement again applies, since a multilayer metallizing must again be employed for similar reasons. This statement is especially significant when CVD-TiN is used. While, in principle, the feasibility of filling with a CVD-TiN plug is described in I. J. Raaijmakers and A. Sherman, Proceedings of $7^{th}$ Int'l IEEE VLSI Multilevel Interconnection Conference, Santa Clara, Calif. 1990, nevertheless this method can be used solely for contacts in which beforehand, as in salicide (an abbreviation for self-aligned silicide) technology, the actual contact and transition zone was formed in a previous multistage process. The method described by Raaijmakers and Sherman cannot be used for contacts with polycrystalline and monocrystalline silicon (because of overly high transition resistances), nor can it be used to metallize via-holes (for the same reason and because of overly high process temperatures).

In the selective CVD of metals and silicides, the goal is that a certain highly conductive material grow selectively (that is, exclusively) on certain substrates to be contacted (such as Si, silicide or metal surfaces). If a suitable substrate for this purpose is present on the bottom of the connecting holes, then direct, shrink-hole-free filling of the holes is possible. In none of the methods named here explicitly or any other imaginable methods has it been possible until now to perform them in a permanently replicable way under production conditions, which is why these methods have not been used industrially.

Their major disadvantages are the following:

the necessity of replicable, efficient cleaning of the contact zones prior to the actual deposition, which becomes increasingly difficult as the aspect ratio of the connecting holes increases;

the massive boundary face reactions, in particular upon contact with silicon, that occur when certain aggressive chemicals such as $WF_6$ are used, and that lead to unacceptably high leakage currents in diodes and transistors;

the resultant narrow process window, caused for instance by ready, frequent "nonselective" deposition on insulator surfaces because of the nucleation seeds that are located there;

the variously deep connecting holes cannot be filled to the same extent (ideally as far as the upper edge of the insulator), or can be still filled only by means of other complicated provisions, since the filler material grows uniformly in the vertical direction from the contact bottom.

SUMMARY OF THE INVENTION

It is accordingly an object of the invention to provide a method for metallizing submicron contact holes in semiconductor bodies, which overcomes the above-mentioned disadvantages of the heretofore-known methods of this general type and which is a reliable method that can be used without limitation in future technologies and that in particular can replace the methods described and named above but does not have their disadvantages.

With the foregoing and other objects in view there is provided, in accordance with the invention, a method for metallizing submicron contact holes in semiconductor bodies, which comprises:

placing a semiconductor body in a CVD chamber; and depositing metal in a submicron contact hole formed in the semiconductor body in a single CVD process inside the CVD chamber, the CVD process including a first step of depositing a titanium-rich layer (e.g. Ti, TiSi) and a second step of depositing a low-impedance $TiSi_2$ layer.

In accordance with a preferred mode of the invention, the step of depositing the $TiSi_2$ layer follows immediately after the step of depositing the titanium-rich layer, without interrupting a vacuum in the CVD chamber.

In other words, the objects of the invention are satisfied with a process in which the contact metallization is generated by means of a single highly conformal CVD process, with which both the contact layer and the low-impedance contact filler material can be deposited in a single CVD chamber. In particular, it is a method in which deposition takes place first from an organometallic titanium-rich layer (ideally Ti or TiSi, hereinafter called CVD-Ti). This is followed immediately thereupon in the same chamber, by joining together further reaction partners or by varying the deposition parameters, with the deposition of a conformal, low-impedance (i.e., 20–40 $\mu\Omega$cm) CVD titanium disilicide layer (CVD-$TiSi_2$). Its thickness depends on the remaining residual diameter of the connecting holes. To complete the metallization, a back-etching process can follow, with which the Ti/$TiSi_2$ "plugs" deposited on the horizontal insulator surfaces remain in the connecting hole. The subsequent wiring is effected as usual by applying and structuring known low-impedance materials, such as AlSi or TiN/AlSiCu, for instance by sputtering. In contact holes with diameters $\leq 0.4$ $\mu$m, the back-etching is unnecessary, since the deposited Ti/$TiSi_x$ layer thickness is approximately 0.2. TiN/AlSiCu is sputtered onto it, for instance, and the Ti/$TiSi_x$/TiN/AlSiCu lamination package is structured as before in a single operation. As an alternative, instead of the back-etching process, in planes where only short metal connections have to be made, the CVD-Ti/$TiSi_2$ layer can be structured at the same time with suitable lithographic/etching methods, so that the contact metallization and the conductor track are formed in a single operation.

Optionally, the method of the invention can be preceded by: cleaning the contact zones (either wet chemically or dry, as needed and depending on the substrate with a preferred chemical or physical component, if possible preferably in situ in multichamber systems, as described in U.S. Pat. No. 5,478,780 or German Patent Application DE-A 41 32 561);

followed by: an annealing step between 450° C. and 800° C., preferably by means of RTP or in a vertical furnace, in order to assure a homogeneous, complete siliciding reaction at the boundary face between Si and CVD-Ti, as described in further detail for instance in U.S. Pat. No. 5,478,780.

The above objects are attained with a process according to the invention in which, inter alia, the excitation of coreactants by coupled-in microwave energy is performed, which occurs spatially separately from the deposition reaction and creates reactive, neutral particles, and these particles are then delivered to the actual reactor (CVD system; this method is called "remote-plasma" CVD). The basic principle of microwave excitation and the method thereof are described in German patent application DE-A 41 32 560.

The method of the invention offers the following advantages in particular:

Because of the complete lack of nonconformal sputtered layers and the use of a single conformal CVD process, no technological limit to its utility—from a geometric standpoint—is now apparent. This effect is promoted by what—in comparison with CVD tungsten, for instance—is a substantially smoother layer surface (roughness of the CVD-$TiSi_2$ <50 nm). In particular, the contact metallizing can readily be combined with modern methods for global planarization, such as CMP (chemical mechanical polishing), which necessarily lead to connecting holes with a high aspect ratio.

Since only CVD-Ti and CVD-$TiSi_2$ are generated quasi-continuously in one operation and in one CVD chamber, fewer contact zones result, and consequently lower transition resistances, which overall leads to lower contact resistances.

In particular, the introductory partial step of highly conformal deposition of CVD-Ti assures a low-impedance contact resistance, since unlike the situation with physical deposition, enough Ti metal can be brought to the contact zone even in contacts with a high aspect ratio. Because of its high affinity with oxygen, this metal bonds with deposit oxide that might be present at the surface of the silicon or aluminum and thus assures low-impedance contacting.

Since the contact metallizing is generated virtually in a single step and in a single chamber, the method proves, especially in comparison with known methods, to be especially economical and production-friendly. Another decisive reason for its being production-friendly is that the risks inimical to production that are associated with the selective CVD methods, for instance (such as excessive boundary face reactions, loss of selectivity, uneven filling of unequally deep connecting holes) do not occur, because of the selected chemistry and the selected method.

The contact metallizing according to the invention enables more-homogeneous distribution of the current over the entire contact volume and hence over the contact surface area as well, since only one material is used (contrast with Ti/TiN/Al or /W, for instance). Hence the current-carrying capacity and the reliability of the contact metallizing is increased substantially in comparison with the prior art methods, especially when the hole diameters are small and the current densities are high.

Other features which are considered as characteristic for the invention are set forth in the appended claims.

Although the invention is illustrated and described herein as embodied in a method for metallizing submicron contact holes in semiconductor bodies, it is nevertheless not intended to be limited to the details shown, since various modifications and procedural changes may be made therein without departing from the spirit of the invention and within the scope and range of equivalents of the claims.

The method of operation of the invention, however, together with additional objects and advantages thereof will be best understood from the following description of specific exemplary embodiments.

DETAILED DESCRIPTION OF EXEMPLARY EMBODIMENTS

The method of the invention can be largely performed with commercially available CVD reactors. Especially suitable reactors are the CVD reactors described in in the aforementioned DE-A 41 32 560 and U.S. Pat. No. 5,478,780.

The process parameters in each case are chosen such that the depositions occur within the boundaries of surface-controlled kinetics, so that ideal conformal layers are obtained.

I. CVD-Titanium Deposition:

Optionally, the deposition of CVD-titanium can be preceded by a so-called sputtering etching step (low-energy Ar ions; 100 eV) or a so-called in-situ precleaning step, as described in further detail in U.S. Pat. No. 5,478,780, for instance.

The following classes of substances can be used, either directly or in combination with microwave-activated coreactants, for titanium CVD depositions as an example, but not exclusively:

1. Titanium tetrachloride=$TiCl_4$
2. Tetrakisdialkylamino titanium=$Ti[NR_2]_4$ where R=methyl, ethyl . . .
3. $\eta^7$-Cycloheptatrienyl-$\eta^5$-cyclopentadienyl titanium (0) $(C_7H_7)Ti(C_5H_5)$

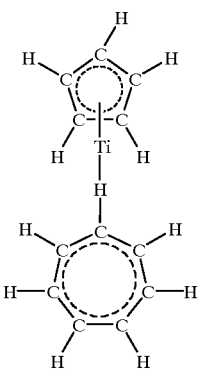

4. $\eta^8$-Cyclooctatestraenyl-$\eta^5$-cyclopentadienyl titanium (III) $(C_8H_8)Ti(C_5H_5)$

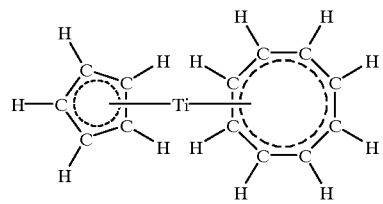

5. Dimeric compounds, such as $[(R,R')_2 Ti (SiH_2)]_2$ e.g. with R, R'=alkyl, aryl, $C_5H_5$, $NR_2$ where R=H, $CH_3$, $C_2H_5$, . . .

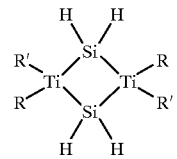

6. Compounds of type $Ti[(CH_2)_2(NR)_2]_2$ with R=H, $CH_3$, $C_2H_5$, Si $(CH_3)_3$, . . . such as

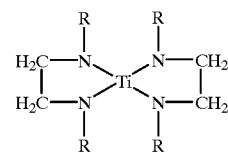

$SiH_4$, $Si_2H_6$ and/or $H_2$ can thereby be used (if necessary) as reducing agents.

All the gases involved may be activated selectively by means of the external microwave excitation and delivered separately to the reactor. The agents $SiH_4$ or $Si_2H_6$ and/or the titanium compound may, however, also be admixed in an unexcited state prior to the so-called shower head electrode. Reaction equation:

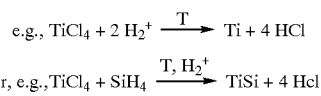

where * indicates "excited".

II. CVD-Titanium Silicide Deposition:

Optionally, the deposition of CVD-titanium can be preceded by a so-called sputtering etching step (low-energy Ar ions; 100 eV) or a so-called in-situ precleaning step.

In principle the same classes of substances as listed in I above can be used, either directly or in combination with microwave—activated coreactants, for the titanium disilicide CVD deposition:
Reaction equation:

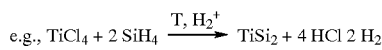

e.g., $TiCl_4 + 2\, SiH_4 \xrightarrow{T,\, H_2^*} TiSi_2 + 4\, HCl\, 2\, H_2$ where * indicates "excited".
Process parameters:

| Excitation: | |
|---|---|
| Microwave power | 300–850 W |
| $H_2$ flow rate | 0–500 sccm |
| Ar or He flow | 20–150 sccm |
| Pressure | $10^{-2}$–$10^{-1}$ Pa |
| Deposition: | |
| Process temperature | 200–550° C. |
| Evaporator temperature | 20–140° C. |
| Carrier gas | Ar, He, $H_2$ |
| Carrier gas flow | 0–100 sccm |
| ($SiH_4$ or $Si_2H_6$ flow | 0–200 sccm) |
| (RF power | 200–800 W) |
| (Electrode spacing | 0.3 to 2.5 cm) |

III. Etching Process:

The CVD Ti/$TiSi_2$ layer can be either back-etched by the process described below far enough that Ti/$T_2$ plugs remain only in the connecting holes or can be structured with the usual photographic etching steps:

Alternatively, instead of the back-etching step, the $TiSi_2$ located on the horizontal surface can also be removed ("ground back") by a CMP (chemical mechanical polishing) step.

III.1. Back-Etching Process:

The back-etching process preferably comprises a "bulk etching step", with which about 90% of the layer deposited on the horizontal insulator surface is etched isotropically. The corresponding plug is then produced in a second, more strongly anisotropic "overetching step", which exhibits strong selectivity to the insulator layer and a minimal loading effect.

| Process Parameters: | Bulk Etching | Overetch | Anisotropic Structuring |
|---|---|---|---|
| $Cl_2$ (sccm) | 30–200 | 10–150 | 30–200 |
| Hbr (sccm) | 5–100 | 5–50 | 5–100 |
| Ar (sccm) | 10–100 | 10–100 | 10–100 |
| $N_2$ (sccm) | — | — | 0–50 |
| Pressure (mTORR) | 100–300 | 5–260 | 100–300 |
| Power (watts) | 200–500 | 50–400 | 200–500 |
| Cathode temperature (° C.) | 10–50 | 10–50 | 10–50 |
| Magnetic field (Gauss) | 0–150 | 0–150 | 0–150 |

The following publications provide additional information with regard to the above-described process, and they are herewith incorporated by reference:

1. P. E. Riley, T. E. Clark J. Electrochem. Soc. Vol. 138, No. 10 (1991), p. 3008
2. U.S. Pat. No. 5,478,780
3. I. J. Raaijmakers and A. Sherman Proceedings 7th Int'l IEEE VLSI Multilevel Interconnection Conference, Santa Clara, Calif. 1990
4. E. K. Broadbent J. Vac. Sci. Technol. B5 (6), 1987, p. 1661
5. T. Amazawa, H. Nakamura and Y. Aita Technical Digest IEEE International Electron Device Meeting, 1987, p. 217
6. C. Bernard, R. Madar and Y. Paulea Solid State Technology, February 1989, p. 79
7. G. N. Parson, Appl. Phys. Lett. 59 (20), 1991, p. 2546
8. J. F. Mission Brodaz et al. Proc. 6th European Conference on CVD, R. Porat, Ed. 1987, p. 280
9. A. Bouteville, A. Royer and J. C. Remy J. Electrochem. Soc., Vol. 134, No. 8, 1987, p. 2080
10. DE-A-4132560
11. B. Aylett Mat. Res. Soc. Symp. Proc., Vol. 131, 1989
12. B. Aylett Transformation of organometallics into common and exotic material: design and activation, R. M. Laine ed., M. Nijhoff publ., 1988, pp. 165–177
13. M. J. Aylett J. Organometallic Chem. Lib., 9, 327, 1978
14. DE-A-4132561 H. Steinhardt, Fa. SECON, Wien, K, Hieber, E. Bußmann, SIEMENS AG, München
15. P. Burggraaf Semiconductor International, December 1990, p. 28.

We claim:

1. A method for metallizing submicron contact holes in semiconductor bodies, which comprises:

providing a semiconductor body that includes a submicron contact hole with a contact zone;

placing the semiconductor body in a CVD chamber;

cleaning the contact zone of the submicron contact hole; and subsequently, depositing metal in the submicron contact hole in a single CVD process inside the CVD chamber, the CVD process including a first step of depositing a titanium-rich layer and a second step of depositing a low-impedance $TiSi_2$ layer to substantially fill the submicron contact hole.

2. The method according to claim 1, wherein the step of depositing the $TiSi_2$ layer follows immediately after the step of depositing the titanium-rich layer, without interrupting a vacuum in the CVD chamber.

3. The method according to claim 1, wherein the titanium-rich layer is selected from the group consisting of Ti and TiSi.

4. The method according to claim 1, wherein the step of depositing the titanium-rich layer comprises depositing the titanium-rich layer at a thickness of approximately 5 to 100 nm.

5. The method according to claim 1, wherein the $TiSi_2$ layer is formed to have a resistance of substantially 20–40 $\mu\Omega$cm.

6. The method according to claim 1, which further comprises, subsequently to the first and second depositing steps and for completing a metallization, back-etching the titanium-rich layer and the $TiSi_2$ layer from horizontal insulator surfaces.

7. The method according to claim 1, which further comprises, subsequently to the first and second depositing steps and for completing a metallization, performing a chemical mechanical polishing step for removing the titanium-rich layer and the $TiSi_2$ layer from horizontal insulator surfaces.

8. The method according to claim 1, which further comprises, subsequently to the step of depositing the metal in the submicron contact hole, contacting the metallized contact hole by applying and structuring low-impedance material.

9. The method according to claim 8, wherein the low-impedance material is selected from the group consisting of AlSi and TiN/AlSiCu.

10. The method according to claim 8, wherein the step of applying the low-impedance material consists of sputtering.

11. The method according to claim 1, which further comprises structuring the Ti/TiSi$_2$ layer deposited in the depositing steps by lithographic and etching processes.

12. The method according to claim 11, wherein the cleaning step comprises cleaning the contact zones by wet chemical or dry cleaning processes.

13. The method according to claim 1, which further comprises, subsequently to metallizing the submicron contact hole, annealing at a temperature between approximately 450° C. and 800° C.

14. The method according to claim 1, which further comprises the step of preparing reactive, neutral particles by exciting coreactants with coupled-in microwave energy outside of the CVD chamber, and delivering the reactive particles into the CVD chamber.

* * * * *